(12) United States Patent
Schweitzer, III et al.

(10) Patent No.: US 10,581,237 B2
(45) Date of Patent: Mar. 3, 2020

(54) HIGH-FREQUENCY ELECTRIC POWER SYSTEM SIGNAL PROCESSING SYSTEM

(71) Applicant: Schweitzer Engineering Laboratories, Inc., Pullman, WA (US)

(72) Inventors: Edmund O. Schweitzer, III, Pullman, WA (US); David E. Whitehead, Pullman, WA (US); Mangapathirao Venkata Mynam, Pullman, WA (US)

(73) Assignee: Schweitzer Engineering Laboratories, Inc., Pullman, WA (US)

(*) Notice: Subject to any disclaimer, the term of this patent is extended or adjusted under 35 U.S.C. 154(b) by 667 days.

(21) Appl. No.: 15/294,580

(22) Filed: Oct. 14, 2016

(65) Prior Publication Data
US 2017/0110875 A1    Apr. 20, 2017

Related U.S. Application Data

(60) Provisional application No. 62/241,754, filed on Oct. 14, 2015.

(51) Int. Cl.
*H02H 3/50*    (2006.01)
*G01R 31/02*    (2006.01)
(Continued)

(52) U.S. Cl.
CPC .............. *H02H 3/50* (2013.01); *G01R 31/021* (2013.01); *G01R 31/085* (2013.01); *G01R 31/40* (2013.01); *H02H 7/22* (2013.01)

(58) Field of Classification Search
CPC .. G01R 31/085; G01R 15/142; G01R 15/181; G01R 15/185; G01R 15/186;
(Continued)

(56) References Cited

U.S. PATENT DOCUMENTS 3,585,298 A    6/1971 Liberman
3,670,240 A    6/1972 Maranchak
(Continued)

FOREIGN PATENT DOCUMENTS

EP    226210    12/1986
EP    241832    7/1990
(Continued)

OTHER PUBLICATIONS

Harshad Mehta, Fault Location Techniques for High-Voltage DC Lines, EPRI EL-4331 Project 2150-1, 1985.
(Continued)

*Primary Examiner* — Thienvu V Tran
*Assistant Examiner* — Nicolas Bellido
(74) *Attorney, Agent, or Firm* — Jared L. Cherry; Richard M. Edge

(57) ABSTRACT

The present disclosure pertains to systems and methods for obtaining and processing high-frequency electric power system measurements for control and monitoring of an electric power system. High-frequency measurements may be used to detect traveling waves and/or to detect faults in the electric power system. In various embodiments, a processing device may receive high-frequency electric power system measurements from each of a local location and a remote location and may process the high-frequency electric power system measurements to identify and locate a fault. The occurrence of and location of a fault and may be used to implement protective actions to remediate identified faults.

20 Claims, 9 Drawing Sheets

(51) Int. Cl.
*G01R 31/08* (2006.01)
*G01R 31/40* (2014.01)
*H02H 7/22* (2006.01)

(58) Field of Classification Search
CPC .. G01R 19/25; G01R 19/2513; G01R 21/133; G01R 31/008; G01R 31/021; G01R 31/025; G01R 31/08; G01R 31/086; G01R 31/088; G01R 31/11; G01R 31/2836; G01R 31/3275; G01R 31/40; G05B 9/02; H02H 1/0007; H02H 1/0092; H02H 3/00; H02H 3/042; H02H 3/046; H02H 3/048; H02H 3/083; H02H 3/42; H02H 3/50; H02H 7/20; H02H 7/22; H02H 7/26; H02H 7/261; H02H 7/263; H02H 7/265; H02H 7/28; H02J 13/0048; H03M 3/43; H03M 3/464; H04B 14/046; H04B 2203/5408; H04B 2203/5416; H04B 2203/5425; H04B 2203/5445; H04B 2203/5479; H04B 2203/5483; H04B 2203/5491; H04B 3/46; H04B 3/542; H04B 3/56; H04L 25/0266; H04L 7/0331; H04L 7/08; Y02B 90/263; Y04S 40/123

See application file for complete search history.

(56) References Cited

U.S. PATENT DOCUMENTS

| | | | |
|---|---|---|---|
| 3,878,460 | A | 4/1975 | Nimmersjö |
| 3,890,544 | A | 6/1975 | Chamia |
| 3,956,671 | A | 5/1976 | Nimmersjö |
| 4,053,816 | A | 10/1977 | Nimmersjö |
| 4,254,444 | A | 3/1981 | Erikson |
| 4,296,452 | A | 10/1981 | Eriksson |
| 4,344,142 | A | 8/1982 | Diehr |
| 4,351,011 | A | 9/1982 | Liberman |
| 4,377,834 | A | 3/1983 | Eriksson |
| 4,499,417 | A | 2/1985 | Wright |
| 4,614,936 | A | 9/1986 | Weidenbruch |
| 4,626,772 | A | 12/1986 | Michel |
| 4,766,549 | A | 8/1988 | Schweitzer |
| 4,797,805 | A | 1/1989 | Nimmersjö |
| 4,800,509 | A | 1/1989 | Nimmersjö |
| 5,198,746 | A | 3/1993 | Gyugyi |
| 5,255,202 | A | 10/1993 | Kido |
| 5,428,553 | A | 6/1995 | Chiba |
| 5,446,387 | A | 8/1995 | Eriksson |
| 5,572,138 | A | 11/1996 | Nimmersjö |
| 5,682,100 | A | 10/1997 | Rossi |
| 5,729,144 | A | 3/1998 | Cummins |
| 6,341,055 | B1 | 1/2002 | Guzman-Casillas |
| 6,417,791 | B1 | 7/2002 | Benmouyal |
| 6,466,031 | B1* | 10/2002 | Hu ........................ G01R 31/085 324/522 |
| 6,477,475 | B1 | 11/2002 | Takaoka |
| 6,597,180 | B1 | 7/2003 | Takaoka |
| 6,686,832 | B2* | 2/2004 | Abraham ............... H04B 3/542 340/12.33 |
| 6,798,211 | B1 | 9/2004 | Rockwell |
| 7,174,261 | B2 | 2/2007 | Gunn |
| 7,535,233 | B2 | 5/2009 | Kojovic |
| 7,714,735 | B2 | 5/2010 | Rockwell |
| 7,733,094 | B2 | 6/2010 | Bright |
| 7,930,117 | B2* | 4/2011 | Guzman-Casillas ........................ G01R 29/18 702/60 |
| 8,315,827 | B2 | 11/2012 | Faybisovich |
| 8,525,522 | B2 | 9/2013 | Gong |
| 8,598,887 | B2 | 12/2013 | Bjorklund |
| 8,655,608 | B2* | 2/2014 | Guzman-Casillas ........................ G01R 31/088 324/522 |
| 8,655,609 | B2 | 2/2014 | Schweitzer |
| 8,781,766 | B2 | 7/2014 | Schweitzer |
| 8,990,036 | B1 | 3/2015 | Schweitzer |
| 9,470,748 | B2 | 10/2016 | Schweitzer |
| 9,594,112 | B2 | 3/2017 | Schweitzer |
| 9,627,881 | B2 | 4/2017 | Schweitzer |
| 2001/0012984 | A1 | 8/2001 | Adamiak |
| 2002/0071452 | A1 | 6/2002 | Abraham |
| 2002/0165462 | A1 | 11/2002 | Westbrook |
| 2003/0222873 | A1 | 12/2003 | Ritter |
| 2004/0189317 | A1 | 9/2004 | Borchert |
| 2004/0230387 | A1 | 11/2004 | Bechhoefer |
| 2005/0151659 | A1 | 7/2005 | Donovan |
| 2006/0012374 | A1 | 1/2006 | Kojovic |
| 2008/0077336 | A1 | 3/2008 | Fernandes |
| 2009/0230974 | A1 | 9/2009 | Kojovic |
| 2009/0231769 | A1* | 9/2009 | Fischer ................. H02H 3/286 361/87 |
| 2011/0058285 | A1 | 3/2011 | Wibben |
| 2011/0173496 | A1 | 7/2011 | Hosek |
| 2011/0264388 | A1 | 10/2011 | Gong |
| 2012/0086459 | A1 | 4/2012 | Kim |
| 2012/0265457 | A1 | 10/2012 | Donolo |
| 2013/0021039 | A1 | 1/2013 | Bjorklund |
| 2013/0096854 | A1 | 4/2013 | Schweitzer |
| 2013/0100564 | A1 | 4/2013 | Zhang |
| 2013/0241622 | A1 | 9/2013 | Zerbe |
| 2014/0074414 | A1 | 3/2014 | Schweitzer, III |
| 2015/0081234 | A1 | 3/2015 | Schweitzer, III et al. |
| 2016/0077149 | A1 | 3/2016 | Schweitzer |
| 2016/0077150 | A1 | 3/2016 | Schweitzer |
| 2016/0084893 | A1 | 3/2016 | Schweitzer |
| 2017/0012424 | A1 | 1/2017 | Schweitzer |
| 2017/0082675 | A1 | 3/2017 | Schweizer |
| 2017/0146613 | A1 | 5/2017 | Schweitzer |

FOREIGN PATENT DOCUMENTS

| | | |
|---|---|---|
| EP | 164711 | 12/1991 |
| EP | 244649 | 4/1992 |
| EP | 627085 | 12/2005 |
| GB | 1463755 | 2/1977 |
| WO | 9519060 | 7/1995 |
| WO | 2007135073 | 11/2007 |
| WO | 2010099585 | 9/2010 |
| WO | 2013119315 | 8/2013 |

OTHER PUBLICATIONS

Masaoki Ando, Edmund O. Schweitzer III, R. A. Baker, Development and Field-Data Evaluation of Single-End Fault Locator for Two-Terminal HVDC Transmission Lines, IEEE Transactions on Power Apparatus and Systems, vol. PAS-104, No. 12, 1985.

Masaoki Ando, Fault Location Techniques for HVDC Lines: Analysis, Development, Simulation, and Field-Data Evaluation, 1984.

P.F. Gale, Overhead Line Fault Location Based on Travelling Waves & GPS, 1993.

Harry Lee, Development of an Accurate Transmission Line Fault Locator Using the Glabal Positioning System and Satellites, 1994.

Hewlett Packard, Traveling Wave Fault Location in Power Transmission Systems, Application Note 1285, 1997.

Michael A. Street, Delivery and Application of Precise Timing for a Traveling Wave Powerline Fault Locator System, 1990.

Sergio Luiz Zimath, Marco Antonio Ramos, Jayme Silva Filho, Joaquim Moutinho Beck, Nei Mueller, Traveling Wave-Based Fault Location Experiences, 2010.

Qualitrol Corporation, Telefault TWS Traveling Wave Fault Locator, Qualitrol Brochure 2004.

PCT/US2012/060089 Patent Cooperation Treaty, International Search Report and Written Opinion of the International Searching Authority, dated Feb. 5, 2013.

Elhaffar, Power Transmission Line Fault Location Based on Current Traveling Waves. TKK Dissertations 107, Espoo 2008, Helsinki University of Technology. Department of Electrical Engineering, Dec. 2008.

(56) References Cited

OTHER PUBLICATIONS

Reason International, Inc., Traveling Wave Fault Location in Power Transmission Systems, White Paper.

Carlos Alberto Dutra, Rafael Rosar Matos, Sergio Luiz Zimath, Jurandir Paz De Oliveira, Joao Henrique Monteiro De Resende, Joaquim Americo Pinto Moutinho, Fault Location by Traveling Waves: Application in High Impedance Events.

N. Fischer, V. Skendzic, R. Moxley, J. Needs, Protective Relay Traveling Wave Fault Location, Feb. 9, 2012.

PCT/US2014/055894 Patent Cooperation Treaty, International Search Report and Written Opinion of the International Searching Authority, dated Dec. 17, 2014.

PCT/US2014/055896 Patent Cooperation Treaty, International Search Report and Written Opinion of the International Searching Authority, dated Dec. 18, 2014.

PCT/US2014/055919 Patent Cooperation Treaty, International Search Report and Written Opinion of the International Searching Authority, dated Dec. 22, 2014.

Borghetti, et al, "On the use of continuous-wavelet transform for fault location in distribution power systems." International Journal of Electrical Power & Energy Systems. Nov. 2006.

Maher M.I. Hashim, Hew Wooi Ping, V.K. Ramachandaramurthy, Impedance-Based Fault Location Techniques for Transmission Lines, Sep. 2009.

Zheng et al., Study on Impedance-Traveling Wave Assembled Algorithm in One-Terminal Fault Location System for Transmission Lines, Apr. 2008.

Gabriel Benmouyal, Karl Zimmerman, Experience With Subcycle Operating Time Distance Elements in Transmission Line Digital Relays, Presented at the 37th Annual Western Protective Relay Conference Oct. 2010.

Edmund O. Schweitzer, III, Armando Guzman-Casillas, Mangapathirao Venkat Mynam, Veselin Skendzic, Bogdan Kasztenny, Stephen Marx, Locating Faults by the Traveling Waves They Launch, Feb. 10, 2014.

Toshio Tahagi, Jun-Ichi Baba, Katauhiko Usmura, Tishiaki Sakaguchi, Fault Protection Based on Travelling Wave Theory—Part I Theory, Jan. 24, 1977.

PCT/US2015/050504 Patent Cooperation Treaty, International Search Report and Written Opinion of the International Searching Authority, dated Jan. 29, 2016.

He, Baina, Yunwei Zhao, and Hengxu Ha. "A Novel Wave Based Differential Protection for Distributed Parameter Line." TELKOMNIKA Indonesian Journal of Electrical Engineering TELKOMNIKA 11.9 (2013): 5097-104.

Tang, Lanxi; Dong, Xinzhou; Shi, Shenxing; Wang, Bin; "Travelling Wave Differential Protection Based on Equivalent Travelling Wave", 13th IET International Conference on Developments in Power System Protection (DPSP 2016), Mar. 7-10, 2016.

PCT/US2016/052329 Patent Cooperation Treaty, International Search Report and Written Opinion of the International Searching Authority, dated Jan. 6, 2017.

PCT/US2017/037345 Patent Cooperation Treaty, International Search Report and Written Opinion of the International Searching Authority, dated Aug. 24, 2017.

PCT/US2017/037288 Patent Cooperation Treaty, International Search Report and Written Opinion of the International Searching Authority, dated Aug. 28, 2017.

PCT/US2016/057218 Patent Cooperation Treaty, International Search Report and Written Opinion of the International Searching Authority, dated Dec. 23, 2016.

\* cited by examiner

HIGH-FREQUENCY ELECTRIC POWER SYSTEM SIGNAL PROCESSING SYSTEM

RELATED APPLICATION

The present application claims priority under 35 U.S.C. § 119(e) to U.S. Provisional Patent Application No. 62/241,754, filed Oct. 14, 2015, titled "HIGH-FREQUENCY ELECTRIC POWER SYSTEM SIGNAL PROCESSING SYSTEM," which is hereby incorporated by reference in its entirety.

TECHNICAL FIELD

This disclosure relates to detecting and locating faults in electric power delivery systems. More particularly, this disclosure relates to using time domain elements and analysis to determine fault location in electric power delivery systems using high-frequency signal processing.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
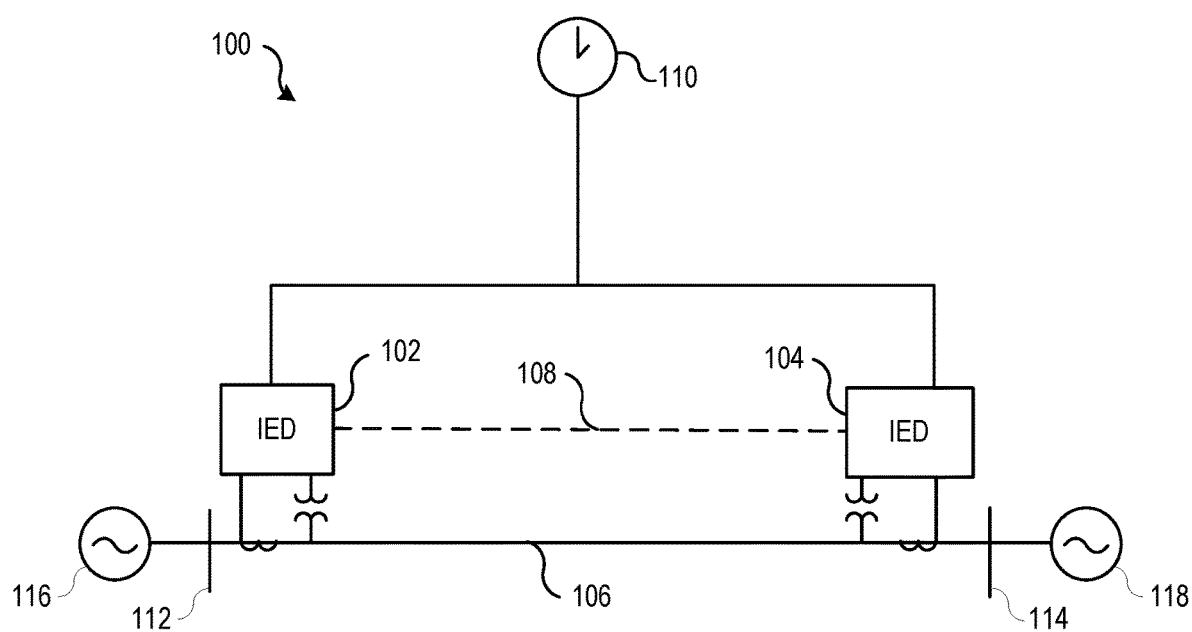
FIG. 1 illustrates a block diagram of a system for detecting a traveling wave and calculating a location of a fault using the detected traveling wave consistent with certain embodiments of the present disclosure.

Faster transmission line protection improves power system stability. If faults are not cleared before the critical fault clearing time, the system may lose transient stability and possibly suffer a black out. In addition, faster fault clearing increases the amount of power that can be transferred. Faster protection also enhances public and utility personnel safety, limits equipment wear, improves power quality, and reduces property damage.

Most protection principles are based on the fundamental frequency components of voltages and currents. Accurate measurement of a sinusoidal quantity typically takes a cycle. To increase the speed of protection actions, an analysis of transient components may be undertaken in connection with various embodiments of the present disclosure. Further, information relating to electrical conditions may be communicated among devices to provide end-to-end transmission line protection.

Primary protective relaying systems typically operate in one to one-and-a-half cycles, and the breakers interrupt current in one-and-a-half to three cycles, so faults are typically cleared in three to four cycles. Sometimes the relaying system operates faster. For example, sensitive instantaneous overcurrent elements can be used for switch-onto-fault events, and may have an operation time as low as one-quarter of a cycle. Traditional frequency domain techniques obtained by extracting fundamental frequency components (phasors) may be applied to identify a fault after transient signals fade. The filtering necessary for phasor measurement results in operating times of about one power cycle, with the best-case times approaching half a cycle for close-in high-current faults.

However, for purposes of determining stability limits for planning purposes, it is most appropriate to utilize conservative protection operating times. If a breaker fails to trip, breaker failure schemes take over, and fault clearing is delayed until the slowest backup breaker operates, which may be around 10 to 12 cycles. If time-coordinated remote backup protection is used instead of breaker failure protection, the fault clearing time may be as high as a few hundred milliseconds.

High-speed protection devices respond to high-frequency signal components, which may be used to detect faults and to realize various advantages. For example, certain nontraditional energy sources, such as wind and solar, are connected to the power system through a power electronics interface. As such, these sources typically have little or no inertia. Their control algorithms protect the converters for network fault conditions. As a result, these sources produce voltages and currents that challenge some protection principles developed for networks with synchronous generators. In contrast, high-speed protection devices configured to respond to high-frequency signal components are less dependent on the sources and more dependent on the network itself. As a result, such relays may be useful in applications near nontraditional sources.

Various embodiments consistent with the present disclosure may analyze traveling waves (TWs) to aid in the detection of faults. When a fault occurs in an electric power system, traveling waves are launched from the fault and travel outward at a propagation velocity near the speed of light on overhead lines. The traveling waves are reflected by buses and other discontinuities according to their corresponding characteristic impedances. The traveling waves may be described by the propagation velocity, the reflection and transmission coefficients, and the line characteristic impedance. Using a traveling wave detection algorithm, a high-speed relay may be able to detect a fault and initiate corrective action in less than 1 millisecond consistent with certain embodiments of the present disclosure.

Ultra-high-speed principles allow relays to identify transient events that are located within the protected zone, for example incipient faults in cables; however, the ultra-high-speed line protection needs to ensure that an in-zone event is a legitimate fault.

Control and monitoring of electric power systems may benefit from high-frequency measurements of electrical conditions in the electric power system. Various systems and methods consistent with the present disclosure may be used to provide high-frequency measurements of electrical conditions in the electric power system to a processing device for coordination, evaluation, display, and to provide control and monitoring to the electric power delivery system. In various embodiments, raw high-frequency measurements may be provided over a communications medium to the processing device. The processing device may coordinate the measurements and process the measurements. The processing device may perform traveling wave operations, time-domain operations, and other operations utilizing the high-frequency measurements.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be illustrated as software modules or components. In other embodiments, hardware-implemented embodiments may be used. Such embodiments may utilize, among other technologies, field-programmable gate arrays. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a machine-readable medium having stored thereon instructions that may be used to program a computer (or other electronic device) to perform processes described herein. The machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic instructions.

FIG. 1 illustrates a block diagram of a system 100 for detecting a traveling wave and calculating a location of a fault using the detected traveling wave consistent with certain embodiments of the present disclosure. System 100 may include generation, transmission, distribution and/or similar systems. System 100 includes a conductor 106 such as a transmission line connecting two nodes, which are illustrated as a local terminal 112 and a remote terminal 114. Local and remote terminals 112 and 114 may be buses in a transmission system supplied by generators 116 and 118, respectively. Although illustrated in single-line form for purposes of simplicity, system 100 may be a multi-phase system, such as a three-phase electric power delivery system.

System 100 is monitored by IEDs 102 and 104 at two locations of the system, although additional IEDs may also be utilized to monitor other locations of the system. As used herein, an IED (such as IEDs 102 and 104) may refer to any microprocessor-based device that monitors, controls, automates, and/or protects monitored equipment within system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs. IEDs 102 and 104 may obtain electric power system information using current transformers (CTs), potential transformers (PTs), Rogowski coils, voltage dividers and/or the like. IEDs 102, 104 may be capable of using inputs from conventional instrument transformers such as CTs and PTs conventionally used in monitoring of electric power delivery. IEDs 102 and 104 may also receive common time information from a common time source 110. In certain embodiments, time information may not be necessary for the elements to operate correctly. For example the traveling wave directional element may not require time information for correct operation.

Common time source 110 may be any time source capable of delivering a common time signal to each of IEDs 102 and 104. In various embodiments, common time source 110 may be a Global Navigation Satellite System ("GNSS"). Examples of GNSS systems include the Global Positioning System ("GPS"), the GLObal NAvigation Satellite System (GLONASS), and the Galileo Satellite System. GNSS systems may be used by multiple devices and applications distributed across large areas, and may avoid the need for costly high-accuracy time sources in multiple locations. In addition to GNSS, common time source 110 may be embodied using an IRIG system, a WWVB or WWV system, a network-based system such as corresponding with IEEE 1588 precision time protocol, and/or the like. According to one embodiment, common time source 110 may comprise a satellite-synchronized clock (e.g., Model No. SEL-2407, available from Schweitzer Engineering Laboratories of Pullman Wash.). Further, it should be noted that each IED 102, 104 may be in communication with a separate clock, such as a satellite-synchronized clock, with each clock providing each IED 102, 104 with a common time signal. The common time signal may be derived from a GNSS system or other time signal.

A data communication channel 108 may allow IEDs 102 and 104 to exchange information relating to, among other things, traveling wave direction, traveling wave polarity, time-domain incremental quantity based fault direction, and other measurements reflecting electrical conditions on conductor 106. According to some embodiments, a time signal based on common time source 110 may be distributed to and/or between IEDs 102 and 104 using data communication channel 108. Data communication channel 108 may be embodied in a variety of media and may utilize a variety of communication protocols. For example, data communication channel 108 may be embodied utilizing physical media, such as coaxial cable, twisted pair, fiber optic, etc. Further, data communication channel 108 may utilize communication protocols such as Ethernet, SONET, SDH, or the like, in order to communicate data.

In several embodiments herein, traveling waves on the electric power delivery system may be used to detect and calculate location of a fault. Two-end fault locating methods, which may be referred to herein as Type D methods, may use a time difference between a traveling wave captured at both terminals along with the line length and wave propagation velocity to compute the fault location. Measurement devices at the line terminals detect the traveling waves and time stamp the arrival of the wave using a common time reference (e.g., IRIG-B or IEEE 1588). In certain embodiments, a distance to a fault location (m) is calculated using Eq. 1.

$$m = \tfrac{1}{2}[L + (t_L - t_R) \cdot v] \qquad \text{Eq. 1}$$

where: $t_L$ is the front wave arrival time at the L Terminal,
$t_R$ is the front wave arrival time at the R Terminal,
v is the wave propagation speed,
L is the line length.

Traditionally these solutions use a master station that accesses the wave arrival times and estimates the fault location. Recently, line relays equipped with traveling wave fault locating function may exchange the wave arrival times, calculate the fault location, and make the fault location available at the relay. One of the key benefits of using the Type D method is its simplicity and immunity to reflections.

Figure 2A:
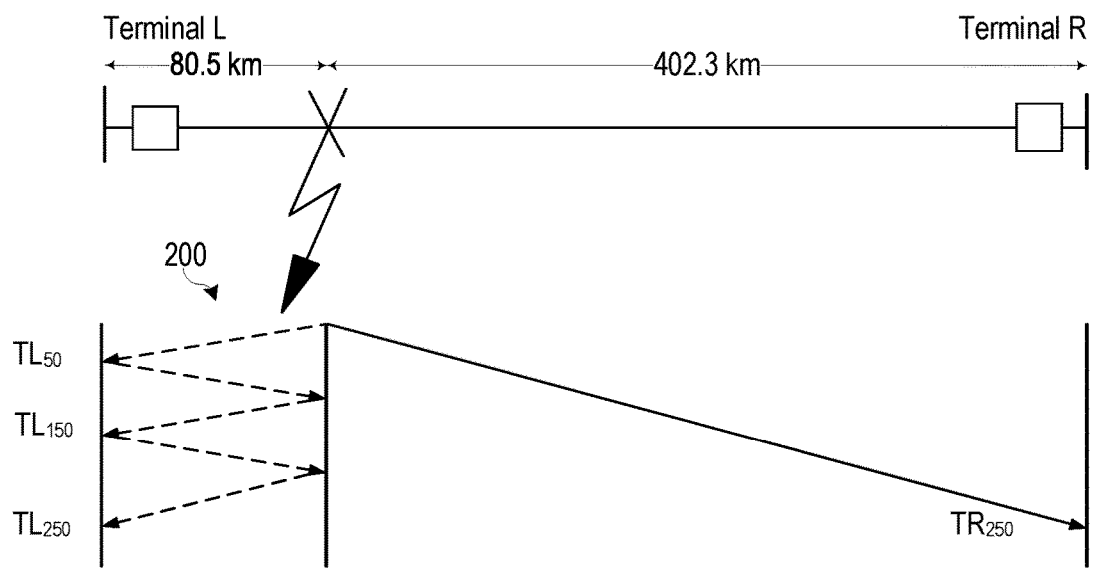
FIG. 2A illustrates a lattice diagram showing incident and reflected traveling waves over a relative time scale created by a fault event on a 300 mile (482.8 km) long transmission line consistent with certain embodiments of the present disclosure.

FIG. 2A illustrates a lattice diagram 200 showing incident and reflected traveling waves over a relative time scale created by a fault event on a 300 mile (482.8 km) long transmission line consistent with certain embodiments of the present disclosure. In the illustrated embodiment, a fault is located 50 miles (80.5 km) from a first terminal on a 300 mile (482.8 km) long line. The incident wave launched by the fault reaches the Terminal L at time $TL_{50}$, and reaches the Terminal R at time $TR_{250}$. The Type D method may use the $TL_{50}$ and $TR_{250}$ to compute the fault location while ignoring all the other waves. When desired, remaining wave arrivals can be used to improve the initial fault location estimate.

Figure 2B:
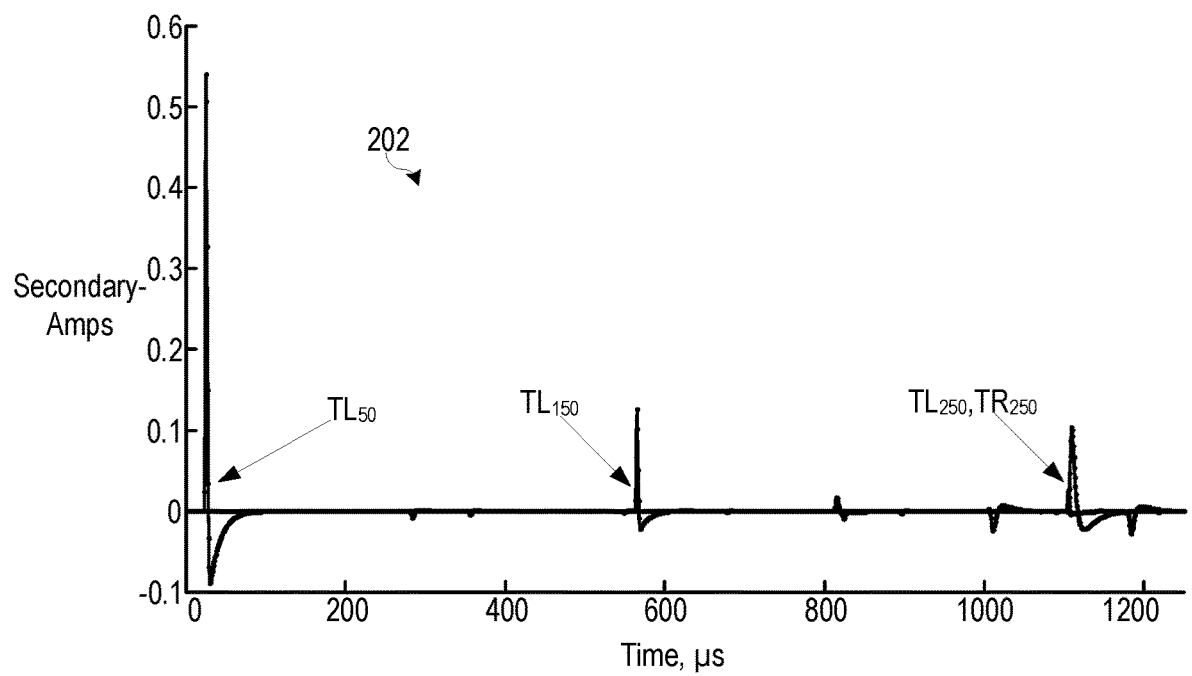
FIG. 2B illustrates the current traveling waves recorded at both terminals as a function of time from the fault illustrated in FIG. 2A consistent with certain embodiments of the present disclosure.

FIG. 2B illustrates the current traveling waves recorded at both terminals as a function of current over time 202 from the fault illustrated in FIG. 2A consistent with certain embodiments of the present disclosure. As illustrated, the magnitude of the reflected traveling waves diminishes with each reflection. Time alignment of data samples received at both Terminal L and Terminal R allows for comparison of the incident and reflected waves from both terminals.

A single-end fault locating method, which is also referred to herein as a Type A fault locating method, uses the time difference between the first arrived traveling wave and a subsequent reflection from the fault or the remote terminal. The Type A method is not dependent on a communication channel to the remote terminal. However, the challenge is to identify and select the appropriate reflection. The Type A method may be useful, according to some embodiments, when the fault location is computed during reclosing events on a permanent fault when one of the terminals is open.

The polarity, amplitude, and arrival time of the reflected waves can be used to identify the reflected wave from the fault or the remote terminal and calculate the fault location. At the L Terminal, the Type A method may use points labeled $TL_{50}$ and $TL_{150}$ in FIG. 2B to compute the fault location while ignoring other waves and reflections. In certain embodiments, a distance to a fault location (m) may be calculated using the Type A method using Equation 2.

$$m = \left(\frac{t_{L2} - t_{L1}}{2}\right) \cdot v \qquad \text{Eq. 2}$$

where: $t_{L2}$ is the arrival time of the first reflection from the fault at the L Terminal;

$t_{L1}$ is the arrival time of the initial wave front from the fault at the L Terminal; and v is the wave propagation speed.

In various embodiments, the polarity of the traveling wave may be used to determine the direction to the fault. Voltage and current polarities are opposite if the fault is in the forward direction. If the fault is in the reverse direction, the voltage and current traveling waves have the same polarity.

Figure 2C:
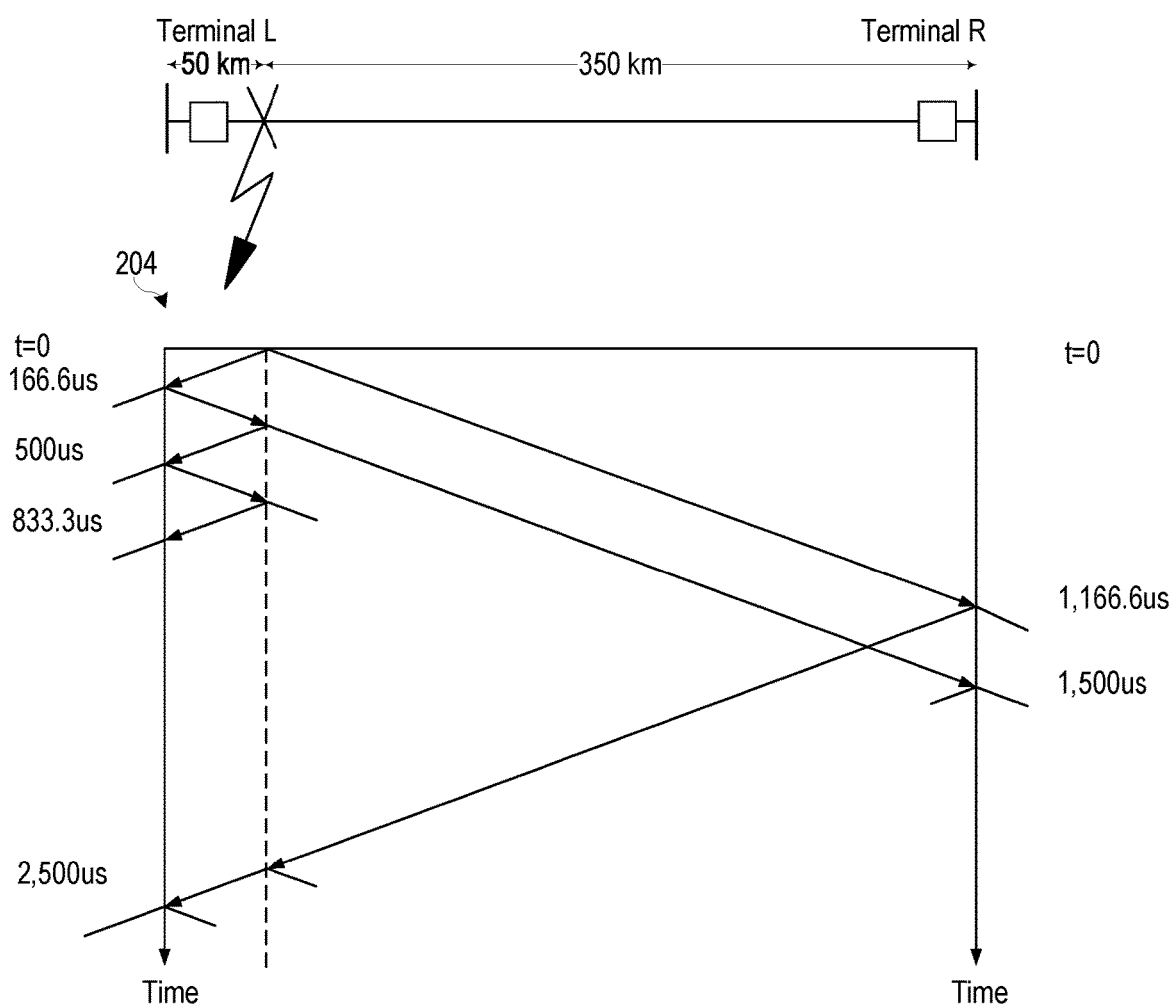
FIG. 2C illustrates a lattice diagram showing the current traveling waves at a remote terminal and a local terminal from a fault event on a 400 km long transmission line consistent with certain embodiments of the present disclosure.

FIG. 2C illustrates a lattice diagram 204 showing the current traveling waves at a remote terminal and a local terminal from a fault event on a 400 km long transmission line consistent with certain embodiments of the present disclosure. Assuming a $3 \times 10^8$ m/s propagation velocity, a fault located at 50 km on a 400 km line would result in a time lag between the initial front-wave and the first legitimate reflection from the fault that may be calculated using Eq. 3.

$$\frac{2 \times 50 \times 10^3}{3 \times 10^8} = 333 \ \mu s \qquad \text{Eq. 3}$$

Further, knowing that the line is 400 km long, it is possible to obtain a delay time estimate for the first wave reflected from the remote terminal. With respect to the instant of fault occurrence, the first reflection from the remote terminal will be per Eq. 4.

$$\frac{(2*400-50)*10^3}{3*10^8} = 2,500 \text{ μs} \qquad \text{Eq. 4}$$

As illustrated in FIG. 2C, a local relay generates measurement with respect to the first arriving wave, which is 166.6 μs, because of the 50 km distance between the local relay and the fault. The estimate determined using Eq. 4 may provide a window in which a reflected wave may be expected after the initial front wave.

While the previously described two-ended and single-ended traveling wave fault location methods provided a more accurate estimate of the location of the fault than was available using, for example, impedance-based methods, these methods were constrained due to reliance on frequency-domain measurements. In the frequency domain, measurements of electric power system voltage and current require a full electric power system cycle to calculate with adequate accuracy. Thus, previous fault detection and location algorithms could not determine a location of a fault faster than one electric power system cycle, for most faults.

In various embodiments, the time-domain based electric power system fault detection and location techniques described herein may not require a complete electric power system cycle to calculate measurements of voltage or current. Conventional PTs and CTs may be used to provide signals corresponding to the voltage and current of the electric power delivery system, which may be used for fault detection and location calculations in less than one electric power system cycle.

Figure 3:
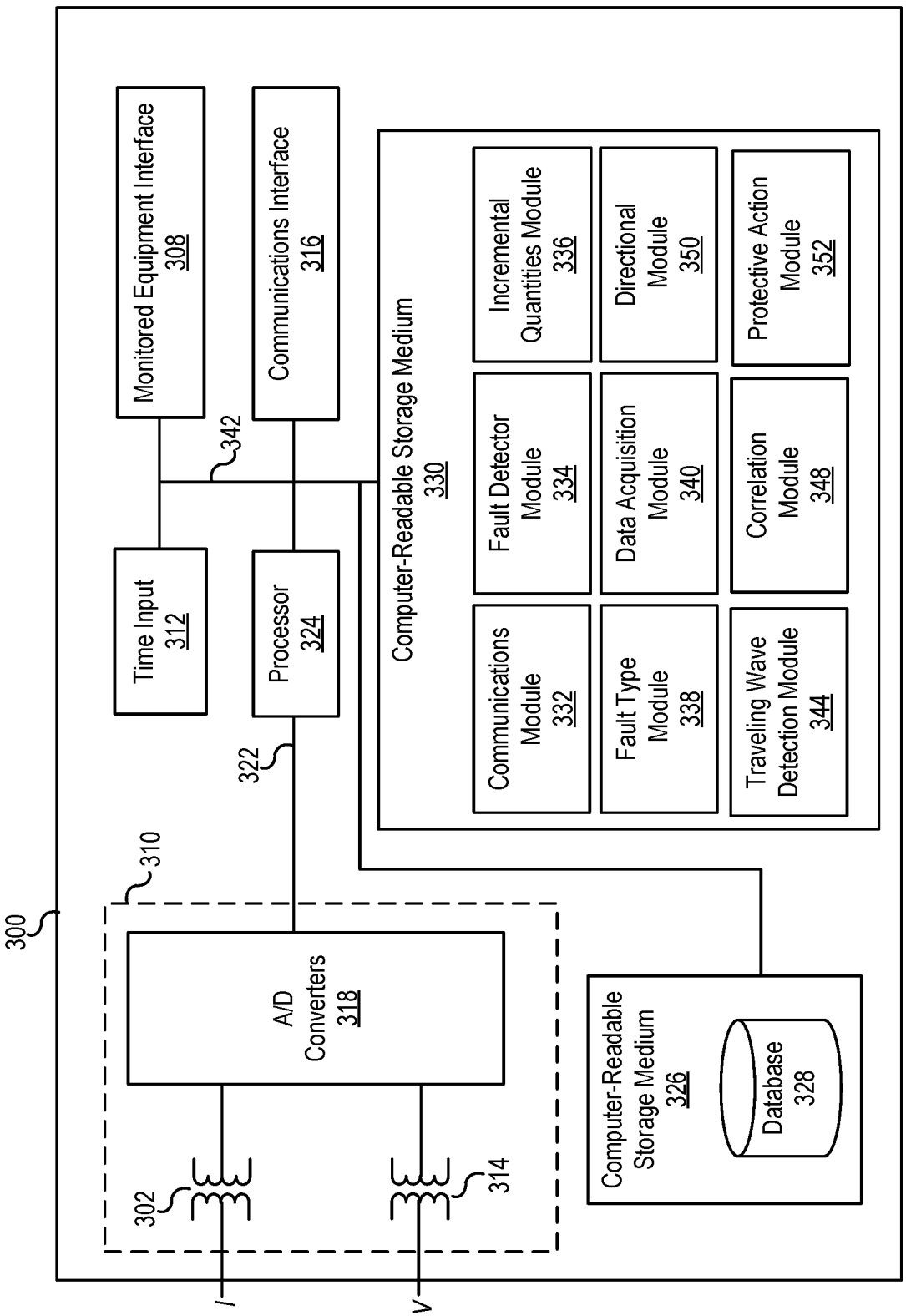
FIG. 3 illustrates a functional block diagram of a system for detecting faults and estimating a fault location using traveling waves and/or incremental quantities consistent with certain embodiments of the present disclosure.

FIG. 3 illustrates a functional block diagram of a system 300 for detecting and locating faults using traveling waves and/or incremental quantities consistent with certain embodiments of the present disclosure. In certain embodiments, the system 300 may comprise an IED system configured to, among other things, obtain and calculate time-domain incremental quantities, detect and locate faults using a time-domain distance module, detect and locate faults using a time-domain directional module, and detect and locate faults using traveling waves. System 300 may be implemented using hardware, software, firmware, and/or any combination thereof. In some embodiments, system 300 may be embodied as an IED, while in other embodiments, certain components or functions described herein may be associated with other devices or performed by other devices. The specifically illustrated configuration is merely representative of one embodiment consistent with the present disclosure.

System 300 includes a communications interface 316 configured to communicate with devices and/or IEDs. In certain embodiments, the communications interface 316 may facilitate direct communication with other IEDs or communicate with systems over a communications network. Communications interface 316 may facilitate communications through a network. System 300 may further include a time input 312, which may be used to receive a time signal (e.g., a common time reference) allowing system 300 to apply a time-stamp to the acquired samples. In certain embodiments, a common time reference may be received via communications interface 316, and accordingly, a separate time input may not be required for time-stamping and/or synchronization operations. One such embodiment may employ the IEEE 1588 protocol. A monitored equipment interface 308 may be configured to receive status information from, and issue control instructions to, a piece of monitored equipment (such as a circuit breaker, conductor, transformer, or the like).

Processor 324 may be configured to process communications received via communications interface 316, time input 312, and/or monitored equipment interface 308. Processor 324 may operate using any number of processing rates and architectures. Processor 324 may be configured to perform various algorithms and calculations described herein. Processor 324 may be embodied as a general purpose integrated circuit, an application specific integrated circuit, a field-programmable gate array, and/or any other suitable programmable logic device.

In certain embodiments, system 300 may include a sensor component 310. In the illustrated embodiment, sensor component 310 is configured to gather data directly from conventional electric power system equipment such as a conductor (not shown) using conventional PTs and/or CTs. The sensor component 310 may use, for example, transformers 302 and 314 and A/D converters 318 that may sample and/or digitize filtered waveforms to form corresponding digitized current and voltage signals provided to data bus 322. Current (I) and voltage (V) inputs may be secondary inputs from conventional instrument transformers such as, CTs and VTs. A/D converters 318 may include a single A/D converter or separate A/D converters for each incoming signal. A current signal may include separate current signals from each phase of a three-phase electric power system. A/D converters 318 may be connected to processor 324 by way of data bus 322, through which digitized representations of current and voltage signals may be transmitted to processor 324. In various embodiments, the digitized current and voltage signals may be used to calculate time-domain quantities for the detection and the location of a fault on an electric power system as described herein.

A computer-readable storage medium 326 may be the repository of a database 328 containing electric power line properties for each transmission line and/or each section of each transmission line, such as impedances, resistances, propagation times, reactances, lengths, and/or the like. Another computer-readable storage medium 330 may be the repository of various software modules configured to perform any of the methods described herein. A data bus 342 may link monitored equipment interface 308, time input 312, communications interface 316, and computer-readable storage mediums 326 and 330 to processor 324.

Computer-readable storage mediums 326 and 330 may be separate mediums, as illustrated in FIG. 3, or may be the same medium (i.e. the same disk, the same non-volatile memory device, or the like). Further, the database 328 may be stored in a computer-readable storage medium that is not part of the system 300, but that is accessible to system 300 using, for example, communications interface 316.

Communications module 332 may be configured to allow system 300 to communicate with any of a variety of external devices via communications interface 316. Communications module 332 may be configured for communication using a variety of data communication protocols (e.g., UDP over Ethernet, IEC 61850, etc.).

Data acquisition module 340 may collect data samples such as the current and voltage quantities. The data samples may be associated with a timestamp and made available for retrieval and/or transmission to a remote IED via communications interface 316. Traveling waves may be measured and recorded in real-time, since they are transient signals that dissipate rapidly in an electric power delivery system. Data acquisition module 340 may operate in conjunction with fault detector module 334. Data acquisition module 340 may control recording of data used by the fault detector module 334. According to one embodiment, data acquisition module 340 may selectively store and retrieve data and may make the data available for further processing. Such processing may include processing by fault detector module 334, which may be configured to determine the occurrence of a fault with an electric power distribution system.

An incremental quantities module 336 may be configured to calculate time domain incremental quantities based on the techniques disclosed herein. The incremental quantities module 336 may be configured to use digitized representations of current and/or voltage measurements to calculate incremental quantities therefrom. In some embodiments, system 300 may comprise a pair of IEDs in communication with different terminals on an electric power system, such as the IEDs and system of FIG. 1. In one embodiment, each IED of a pair of IEDs may calculate incremental quantities in its own incremental quantities module 336 for later processing and sharing between the IEDs. In another embodiment, system 300 may receive digitized representations from both the sensor component 310 and from a remote IED over a communications channel, and the incremental quantities module 336 may be configured to calculate incremental signals from both sources and to calculate both local and remote incremental quantities.

A fault type module 338 may be configured to determine a fault type using incremental quantities from module 336.

Traveling wave detection module 344 may be configured to extract traveling waves from the digitized voltages and current measurements. This module can determine a control operation to take due to occurrence of a fault using current and/or voltage traveling wave quantities. A correlation module 348 may be configured to receive local and remote digitized voltage and current measurements, and/or traveling wave voltages and current, and correlate them. In various embodiments, the correlation may be done using time aligned measurements.

A directional module 350 may be configured to determine a direction (forward or reverse) to a fault. The directional module 350 may be configured to use incremental quantities from incremental quantities module 336 to determine a direction to a fault. In certain embodiments, directional module 350 may be configured to determine the direction based on the polarity of traveling waves. In such embodiments, the polarities of the voltage and current traveling waves are opposite if the fault is in the forward direction. If the fault is in the reverse direction, the voltage and current traveling waves have the same polarity.

A protective action module 352 may be configured to implement a protective action based on the declaration of a fault by the fault detector module 334. In various embodiments, a protective action may include tripping a breaker, selectively isolating a portion of the electric power system, etc. In various embodiments, the protective action module 352 may coordinate protective actions with other devices in communication with system 300.

In various embodiments system 300 may be configured to provide protection based on instantaneous voltages and currents. Such signal components require shorter data windows but may facilitate faster protection. Various embodiments of system 300 may be configured to achieve an operating time of approximately 1 millisecond. Such a system may utilize a incremental quantity-based and TW-based time-domain approach and may allow for versatile applications covering various relay input voltage sources and available communications channels. Such a system may utilize high sampling rates ($\geq 1$ MHz), high-resolution ($\geq 16$ bits) synchronized sampling, high-fidelity time synchronization, and a communications network capable of exchanging all acquired data ($\geq 100$ Mbps), or high numeric burden required by some of the algorithms G multiplications per second).

Although several embodiments discussed hereinabove refer to three phases of an alternating-current electric power delivery system, the principles herein may be applied to a multiple-phase alternating-current electric power system having more or less than three phases. For example, a four-phase electric power delivery system is contemplated, as is a six-phase electric power delivery system. The principles taught herein may be applied thereto. In other embodiments, the principles taught may be applied to a direct-current electric power delivery system. In particular, traveling wave detection using currents only in a traveling wave differential module may use current quantities from a direct-current electric power delivery system to detect faults and take control actions thereon. Still further, although several disclosed embodiments have referred to current traveling waves, voltage traveling waves may be analyzed in addition to or in place of current traveling waves.

In some embodiments, a traveling wave differential module consistent with the present disclosure may operate using representations of electrical conditions from terminals on opposite sides of a transmission line, where the current quantities include time stamps. The traveling wave differential module may time align the time stamped current quantities from each terminal.

Figure 4:
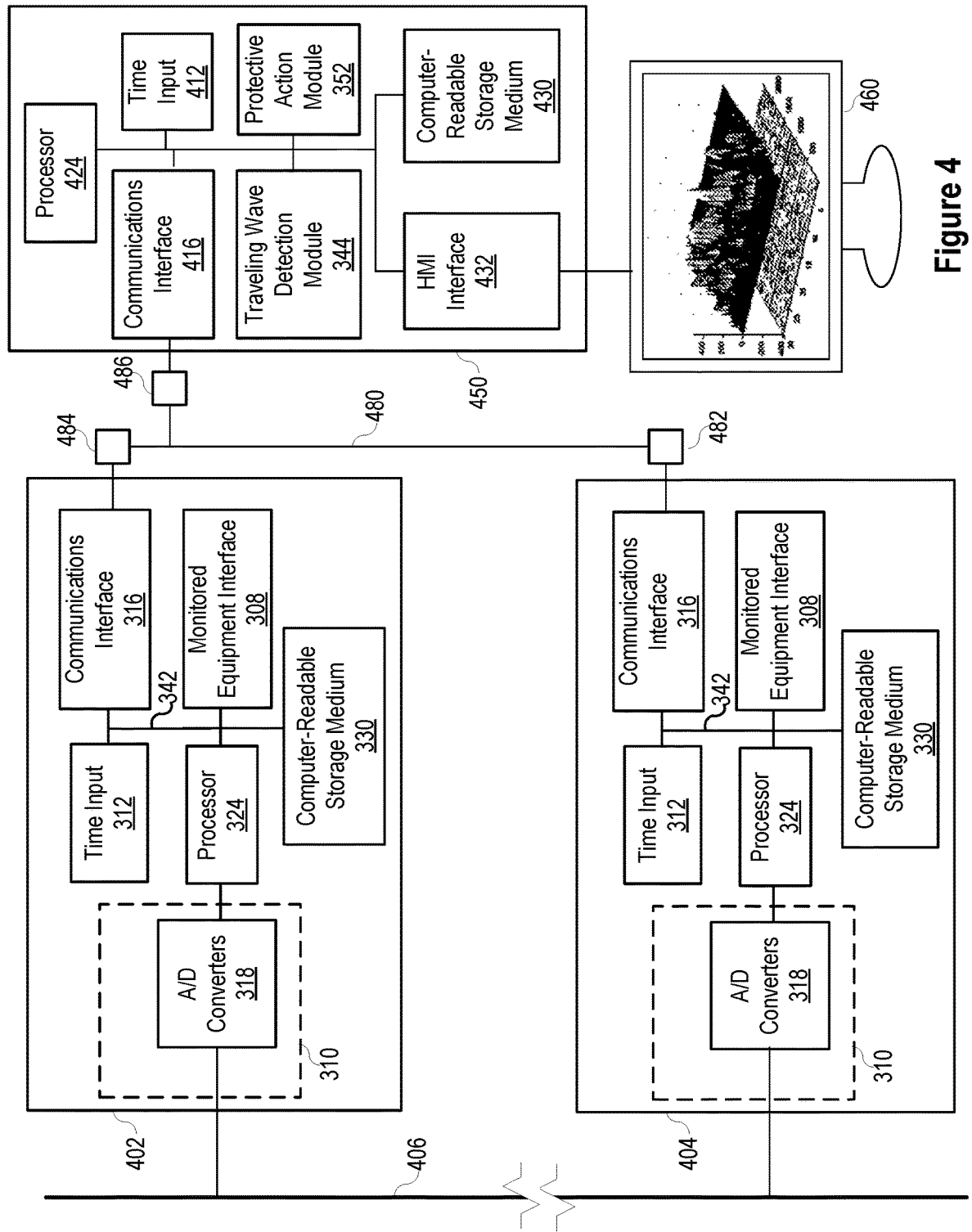
FIG. 4 illustrates a system for obtaining and correlating high-frequency electric power system signals consistent with certain embodiments of the present disclosure.

FIG. 4 illustrates a system for obtaining and correlating high-frequency electric power system signals consistent with certain embodiments of the present disclosure. The system may include a plurality of IEDs 402, 404 that may be modeled after IED 300. IEDs 402 and 404 may be configured, therefore, to obtain high-frequency measurements from an electrical conductor 406. Electrical conductor 406 may be an electrical transmission line, and IEDs 402, 404 may be disposed at opposite ends of the transmission line. IEDs 402, 404 may monitor conductor 406 for high-frequency electric power system signals and/or monitor time-domain electric power delivery system operations. IEDs 402 and 404 may be in communication using a communication network 480 using communication switches 482, 484. IEDs 402, communication network 480 and switches 482, 484 may be configured to facilitate time-deterministic communication of the high-frequency electric power system measurements for use by the IEDs 402 and 404 for traveling wave and time-domain operations.

Processing system 450 may be in communication with the communication network 480 via communication switch 486 to obtain the high-frequency electric power system measurements obtained and communicated by the IEDs 402 and 404. Processing system 450 may include a communications interface 416 for interfacing with the communications network 480. Communications interface 416 may be in communication with a processing bus of the processing system 450, which is also in communication with a processor 424, time input 412, and computer-readable storage medium 430. Time input 412 may be in communication with a common time source. Processor 424 may be configured to execute operations stored on the computer-readable storage medium 430 using the high-frequency electric power system measurements obtained using the communications interface and a time signal from the time input 412.

In some embodiments a time signal received via time input 412 may be provided to IEDs 402, 404 through communication interfaces 316. The IEEE 1588 standard may be used to transmit high-precision time information within a network. A human machine interface 432 may be in communication with a display device 460 to display information obtained regarding the electrical conditions associate with conductor 406.

In some embodiments, the display may include a waterfall display of events occurring on the electric power delivery system, detected using the high-frequency electric power system signals. For example arcing events, events due to degradation of insulators, or faults may launch traveling waves. The display may include one axis showing location (distance along a power line) and another axis may show time. Event strength may be shown along yet another axis.

A traveling wave detection module 344 and a protective action module 352 may be configured to detect and remediate a fault on electrical conductor 406. Upon the detection of a fault based on traveling waves launched by the fault, the protective action module 352 may coordinate the implementation of a protective action using monitored equipment interfaces 308. In one embodiment, monitored equipment interfaces 308 may be connected to a breaker (not shown) that may be tripped to clear the fault.

Figure 5:
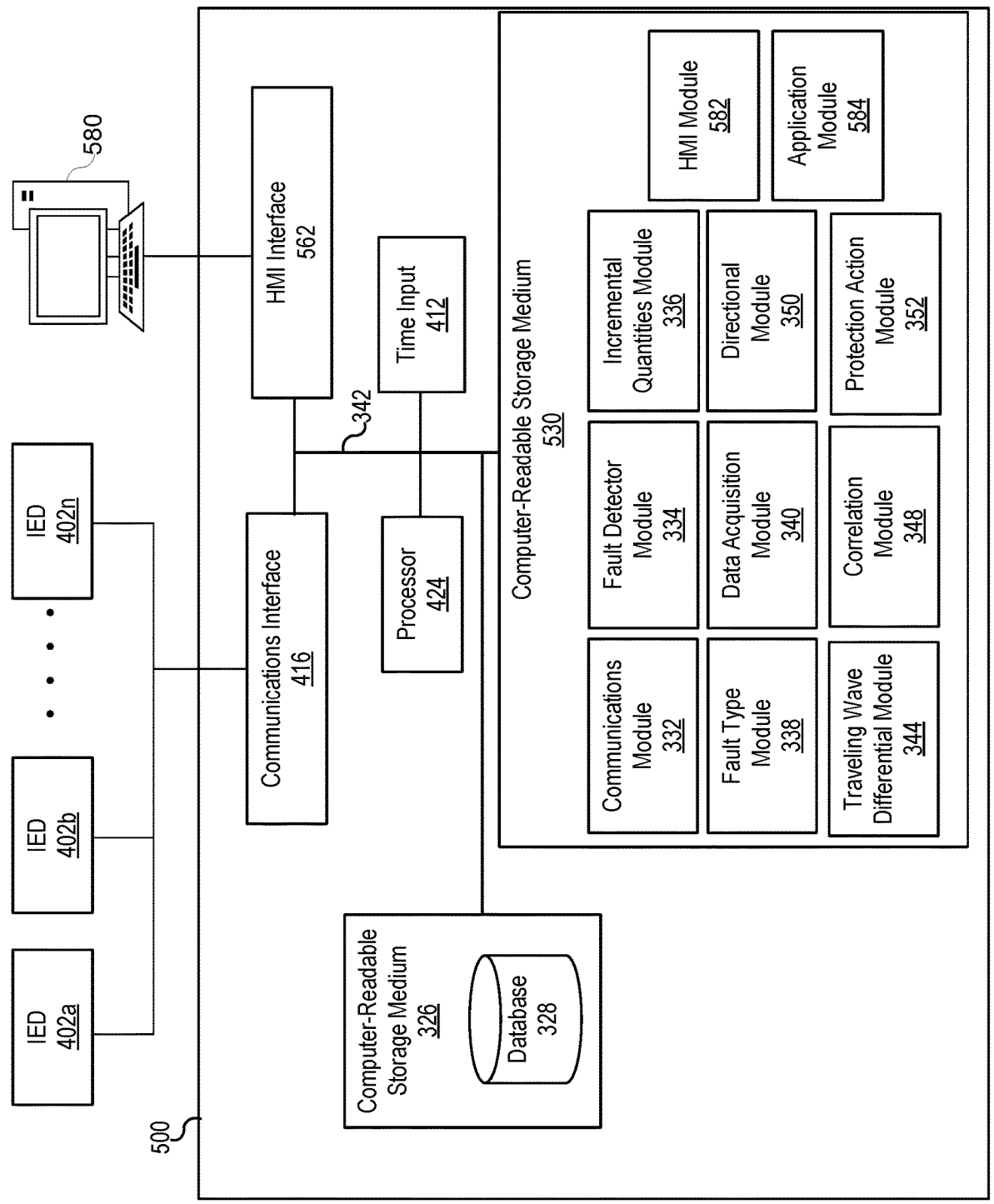
FIG. 5 illustrates a functional block diagram of a high-frequency electric power system signal processor consistent with certain embodiments of the present disclosure.

FIG. 5 illustrates a functional block diagram of a high-frequency electric power system signal processing system 500 consistent with certain embodiments of the present disclosure. The processing system 500 is in communication with a plurality of IEDs 402a, 402b, and 402n which may be similar to IED 402 of FIG. 4 and/or IED 300 of FIG. 3. As with IED 300, processing system 500 may include a first computer-readable storage medium 326, computer-readable storage medium 530 similar to those of IED 300 of FIG. 3. Computer readable storage medium 530 of processing system 500 may include one or more modules for processing the high-frequency electric power system measurements. In particular, the computer readable storage medium 530 may include several of the modules of IED 300 for traveling wave and/or time-domain operations.

Computer readable storage medium 530 may further include an HMI module 582 configured to generate a display for a human-machine interface ("HMI"). The HMI module 582 may be further configured to receive user input from an HMI such as a separate device, front-panel HMI, or the like. The HMI module 582 may be configured to generate a display of the traveling wave and/or time-domain operations. In one particular embodiment, the HMI module 582 may be configured to generate a waterfall display of electric power system events using the traveling wave and/or time-domain operations. The electric power system events may include, for example, faults, flashovers, or smaller arcing events.

Computer-readable storage medium 530 may further include an application module 584. Application module 584 may be configured to receive additional modules or applications from a user using the HMI and/or the communications interface. Additional modules may be stored in the computer-readable storage medium and executed using the processor 424. In one embodiment, the application module 584 may be configured to allow a user to build a module or application for storage on the computer-readable storage medium and execution by the processor 424. Thus, processing system 500 allows for additional applications to be run using the high-frequency electric power system measurements.

Processing system 500 may further include an HMI interface 562 in communication with the bus 342. The HMI interface 562 may be in communication with an HMI, laptop computer, workstation, or other HMI 580. The HMI interface 562 may be configured to provide a display to the HMI 580 corresponding with the traveling wave and/or time-domain operations of the processing system 500. The display may be generated using the HMI module 582.

Figure 6:
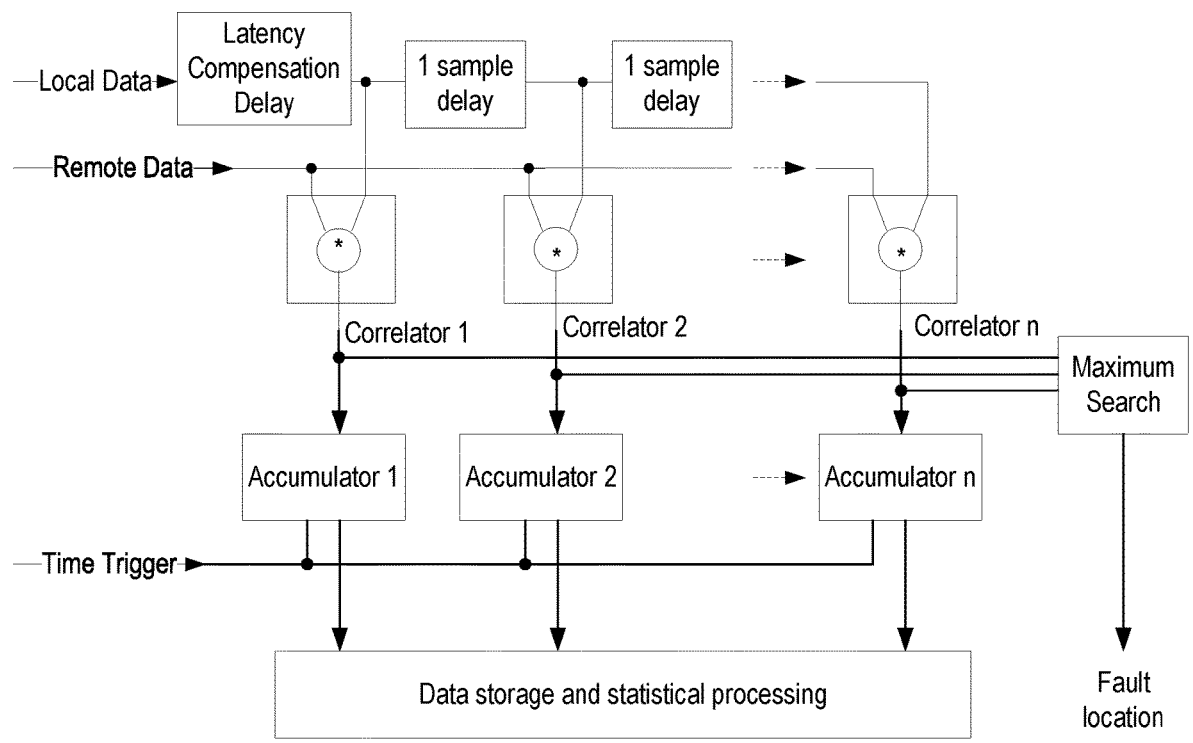
FIG. 6 illustrates a block diagram of a system configured to use a correlation technique for determining a fault location consistent with certain embodiments of the present disclosure.

FIG. 6 illustrates a block diagram of a system configured to use a correlation technique for determining a fault location consistent with certain embodiments of the present disclosure. The correlation technique may be used by correlation module 348. In the embodiment illustrated in FIG. 6, a traveling wave differential module may use multiplication instead of signal addition and may be referred to as a correlation technique.

Correlation calculations can be performed upon detection of the traveling wave signal or continuously for every input signal sample. Correlator output may further be filtered by averaging a number of output results (samples) with filter length adjusted to encompass single wave peaks. Operation of the correlator may further be modified to search for the time delay P; using P as the unknown variable and performing calculations for all time delays in the range P≤T (all delays lower than the line propagation delay T).

In various embodiments, a correlation technique can also be applied to continuous monitoring of the transmission line health. In this approach, a transmission line is subdivided into a number of segments with a separate correlator assigned to each segment as shown in FIG. 6. One objective of such an approach is to detect any energy that may be originating from a particular line segment. This energy may include excessive corona discharge, partial insulation breakdown and localized insulator arcing that may be present before the fault and lightning strikes in the immediate vicinity of the line. Line activity is monitored continuously with high frequency energy originating in each segment accumulated over a selectable time period as commanded by the Time Trigger signal (for example 1 second to 24 hours). Accumulated data is subsequently stored for further statistical analysis and alarming purposes.

As illustrated in FIG. 6, individual correlators are fed by two signals. The remotely measured signal (current or voltage for a given phase) obtained through communications and a delayed version of the locally measured signal on the same phase. Each correlator may receive a different delay such that the signals generated on a given segment on the transmission line are lined up to the selected correlator inputs regardless of the fact they are measured on different ends of the transmission line.

Any number of correlators (observed line segments) may be linked to the sampling frequency used to perform measurements at the two ends of the line. For example, with a sampling frequency set to 1 MHz, and the known propagating speed of the traveling wave signals (close to the speed of light c=299.8e6 m/s), the traveling wave will travel 299.8 m (shown as 300 m herein) between two consecutive samples. If the correlator delays are set one sample (1 μs) apart, spatial resolution becomes equal to one half of the travel time 300 m/2=150 m. The number of correlators required to cover the entire line length can be calculated according to:

$$n = 2*L*\frac{fs}{c} \quad \text{Eq. 5}$$

where:
  n is the number of correlators.

L is the line length c is the traveling wave propagating speed which is close to the speed of light fs is the sampling frequency FIG. 6 also shows a real time "Maximum Search" component preferably running at the correlator rate (i.e. 1 MHz). This component is tasked with finding the highest correlator output in real time, and reporting it as a possible fault location candidate. Since each correlator is associated with a particular segment of the line; highest output associated with the traveling wave arrival directly identifies exact location of the power system fault that caused the traveling wave.

In various embodiments, the sampling frequency may be adjusted (higher or lower than 1 MHz), with the total number of correlators selected to meet the desired spatial resolution. Individual correlators can be assigned to individual transmission line phases (A,B,C) multiplying the total number of correlators required to cover the line by 3.

Figure 7:
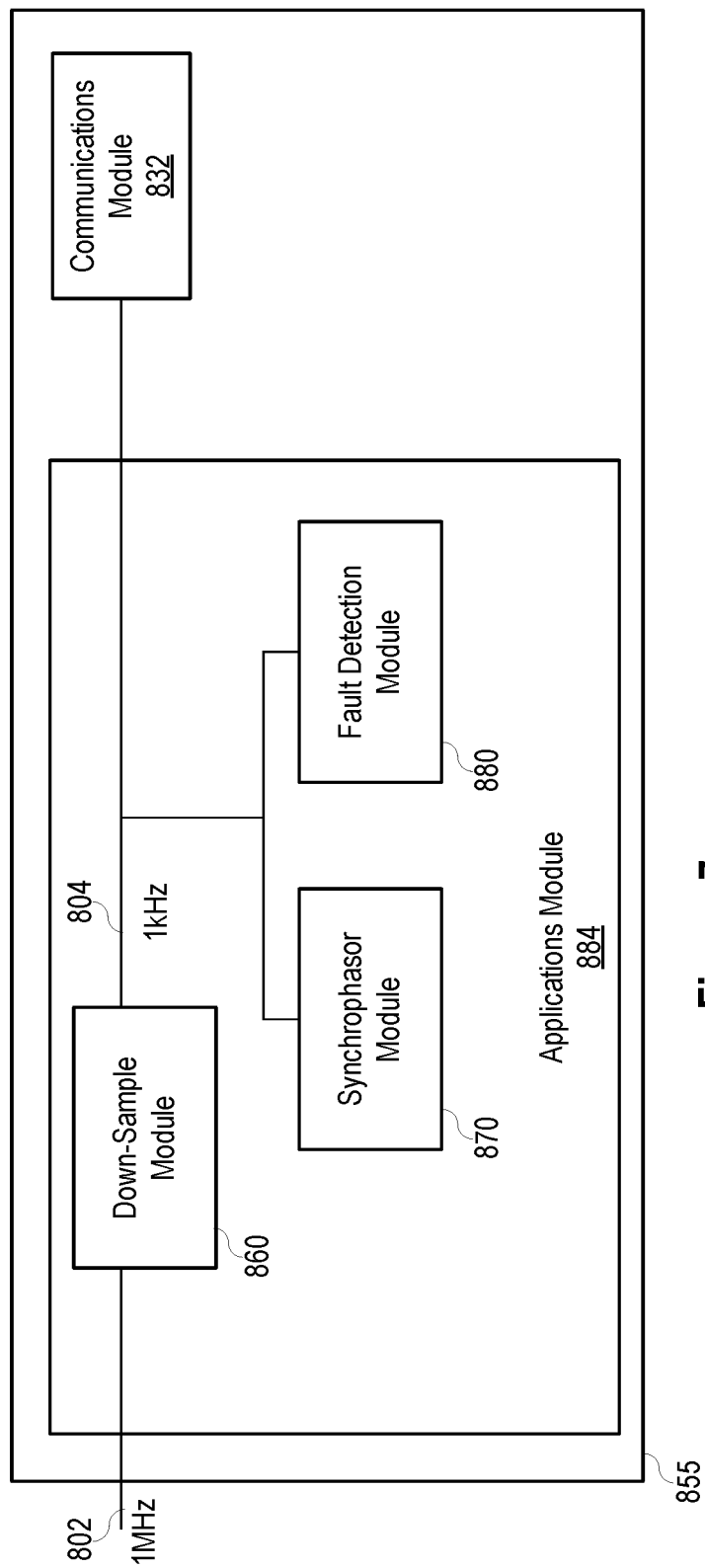
FIG. 7 illustrates a simplified block diagram of an applications module consistent with certain embodiments of the present disclosure.

FIG. 7 illustrates a simplified block diagram of an applications module 884 consistent with certain embodiments of the present disclosure. In some embodiments, the applications module 884 may embody the applications module illustrated in FIG. 5. As discussed above, the processing system 855 may receive samples 802 from the IEDs at a rate of around 1 MHz. Various applications that use electric power system measurements do not require samples at a rate of 1 MHz, but instead use samples at a lower rate such as around 1 kHz. Applications module 884 may include a down-sample module 860 for receiving the 1 MHz sample input 802 and down-sample the input to a lower rate 804 such as a rate of around 1 kHz. The 1 kHz signal 804 may be then used by various other applications in the applications module 884 such as, for example, a synchrophasor module 870, a fault detection module 880, and the like. A synchrophasor module 870 may include instructions executed by the processor to calculate synchrophasors from the electric power system measurements. A fault detection module 880 may include instructions executed by the processor to perform fault detection operations such as impedance-based fault detection calculations, calculation of symmetrical components, fault detection using symmetrical components, and the like. Applications using the 1 kHz signal 804 may include applications executed by traditional electric power system protective devices.

Furthermore, the down-sample module 860 may be in communication with the communication module 832 such that the down-sampled signal 804 may be transmitted to the communications module 832. The communications module 832 may then transmit the down-sampled signal 804 to other devices via the communications interface 416 (FIGS. 4 and 5). Thus, the processing system 855 may be used to stream a down-sampled signal 804 to devices that use such down-sampled signal 804. The streaming of the down-sampled signal 804 may be according to a protocol such as the IEEE 61850 protocol.

Although several embodiments discussed hereinabove refer to three phases of an alternating-current electric power delivery system, the principles herein may be applied to a multiple-phase alternating-current electric power system having more or less than three phases. For example, a four-phase electric power delivery system is contemplated, as is a six-phase electric power delivery system. The principles taught herein may be applied. In other embodiments, the principles taught may be applied to a direct-current electric power delivery system. In particular, traveling wave detection using currents only in a traveling wave differential module may use current quantities from a direct-current electric power delivery system to detect faults and take control actions thereon.

Figure 8:
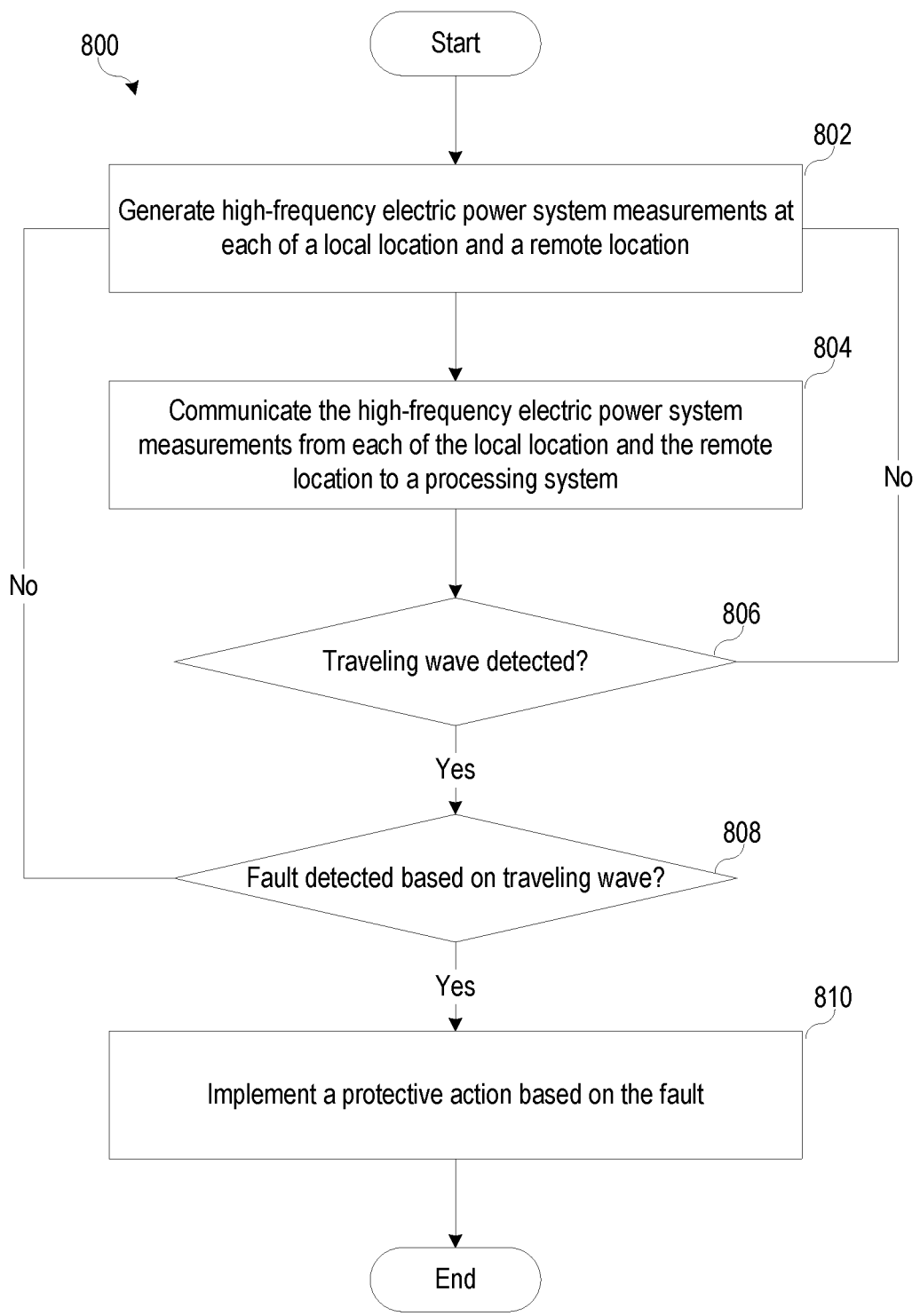
FIG. 8 illustrates a flow chart of a method for monitoring an electric power delivery system and detecting a fault consistent with embodiments of the present disclosure.

FIG. 8 illustrates a flow chart of a method 800 for monitoring an electric power delivery system and detecting a fault consistent with embodiments of the present disclosure. At 802, high-frequency electric power system measurements may be generated at each of a local location and a remote location. In some embodiments, the local location and the remote location may be disposed at opposite ends of a transmission line in an electric power system. The high-frequency electric power system measurements may be obtained by a local IED and a remote IED. In certain embodiments, the high-frequency electric power system measurements may be generated by system 300, as illustrated in FIG. 3.

At 804, the high-frequency electric power system measurements may be communicated to a processing system. In various embodiments, the electric power system measurements may comprise digitized representations of electrical conditions at the local location and the remote location. In some embodiments, the high-frequency electric power system measurements may be associated with time stamps that may be used to time-align the measurements. In certain embodiments, the processing system may be embodied as processing system 500, as illustrated in FIG. 5.

At 806, method 800 may determine whether a traveling wave has been detected based on the high-frequency electrical power system measurements. A variety of techniques may be utilized to identify and detect a traveling wave based on time-domain quantities. Still further, various characteristics, such as the amplitude, polarity, duration, etc., may be analyzed to detect the traveling wave. If a traveling wave is not detected, method 800 may return to 802.

At 808, method 800 may determine whether the traveling wave is associated with a fault. Certain actions in an electric power system may launch traveling waves, such as opening or closing a breaker, connecting a capacitor back, changing a tap in a transformer, etc. These actions do not correspond to a fault, and as such, should not trigger protective action. Various techniques may be utilized to ensure that a detected traveling wave is the result of a fault rather than a planned action. In the event that the traveling wave does not correspond to a fault, method 800 may return to 802.

At 810, a protective action may be implemented based on the fault. The protective action may clear the fault by performing certain actions within the electric power system. For example, the protective action may comprise opening a breaker to selectively disconnect a portion of the electric power system affected by the fault.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed is:

1. A system for monitoring an electric power delivery system by gathering high-frequency electric power system measurements therefrom, comprising:
  a communication interface configured to communicate with:
    a local intelligent electronic device ("IED") in electrical communication with a local location of the electric power delivery system and configured to communicate high-frequency electric power system measurements based on electrical conditions at the local location; and a remote IED in electrical communication with a remote location of the electric power system and configured to communicate high-frequency electric power system measurements based on electrical conditions at the remote location;

a correlation module in communication with the traveling wave detection subsystem to correlate the high-frequency electric power system measurements based on electrical conditions at the remote location with time-delayed high-frequency electric power system measurements based on electrical conditions at the local location;

a fault detection subsystem configured to detect a fault based on the correlation of the high-frequency electric power system measurements; and a protective action subsystem configured to implement a protective action based on the fault.

2. The system of claim 1, further comprising a human-machine interface configured to display a representation of the fault.

3. The system of claim 2, wherein the representation of the fault comprises a waterfall display.

4. The system of claim 1, wherein the high-frequency electric power system measurements comprise a sampling rate of at least 1 MHz.

5. The system of claim 1, wherein the high-frequency electric power system measurements comprise a resolution of at least 16-bits per sample.

6. The system of claim 1, further comprising a time input configured to receive a time signal from an external source, wherein the time signal is used to time-align the high-frequency electric power system measurements from the local IED and the remote IED.

7. The system of claim 1, further comprising:
a down-sampling subsystem configured to generate a down-sampled representation of the high-frequency electric power system measurements.

8. The system of claim 7, wherein the fault detection subsystem is configured to detect the fault based on the down-sampled representation.

9. The system of claim 7, further comprising an application subsystem configured to execute a plurality of additional modules configured to use the down-sampled representation.

10. The system of claim 1, wherein the protective action is communicated through the communication interface to one of the local IED and the remote IED for implementation.

11. The system of claim 1, wherein the fault detection subsystem is further configured to determine a location of the fault based on the correlation.

12. The system of claim 11, wherein the location of the fault is based on a correlation between a high-frequency electric power system measurement based on electrical conditions at the remote location and the time delay of a correlated high-frequency electric power system measurement based on electrical conditions at the local location.

13. The system of claim 1, wherein the correlation module comprises a plurality of correlators associated with particular segments on the electric power delivery system.

14. A method for monitoring an electric power delivery system and detecting a fault, the method comprising:
generating high-frequency electric power system measurements at each of a local location and a remote location;
communicating the high-frequency electric power system measurements from each of the local location and the remote location to a processing system;
correlating the high-frequency electric power system measurements from the remote location with time-delayed high-frequency electric power system measurements from the local location;
detecting a fault based on the correlation of the high-frequency electric power system measurements; and
implementing a protective action based on the fault.

15. The method of claim 14, further comprising:
displaying a representation of the fault on a human-machine interface.

16. The method of claim 14, further comprising:
aligning the high-frequency electric power system measurements generated by the local IED and the remote IED using a time signal from an external source.

17. The method of claim 14, further comprising:
generating a down-sampled representation of the high-frequency electric power system measurements; and
providing the down-sampled representation to a plurality of additional modules configured to use the down-sampled representation.

18. The method of claim 14, further comprising:
determining a location of the fault based on the correlation.

19. The method of claim 17, wherein determining the location of the fault is based on a correlation between an electric power system measurement from the remote location and the time delay of the correlated electric power system measurement from the local location.

20. The method of claim 14, wherein the correlating comprises delaying electric power system measurements from the local and remote locations based on a number of correlators, each correlator associated with a particular segment on the electric power delivery system.

* * * * *